United States Patent
Russell

(10) Patent No.: US 8,400,819 B2
(45) Date of Patent: Mar. 19, 2013

(54) INTEGRATED CIRCUIT HAVING VARIABLE MEMORY ARRAY POWER SUPPLY VOLTAGE

(75) Inventor: Andrew C. Russell, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 429 days.

(21) Appl. No.: 12/714,079

(22) Filed: Feb. 26, 2010

(65) Prior Publication Data

US 2011/0211383 A1    Sep. 1, 2011

(51) Int. Cl.
  *G11C 11/00* (2006.01)
(52) U.S. Cl. ............... 365/154; 365/189.09; 365/210.1; 365/226
(58) Field of Classification Search .................. None
  See application file for complete search history.

(56) References Cited

U.S. PATENT DOCUMENTS

| | | | |
|---|---|---|---|
| 4,585,955 A | 4/1986 | Uchida | |
| 4,714,845 A | 12/1987 | Devecchi et al. | |
| 4,780,854 A | 10/1988 | Wantanabe et al. | |
| 4,868,483 A | 9/1989 | Tsujimoto | |
| 5,430,682 A | 7/1995 | Ishikawa et al. | |
| 5,552,740 A | 9/1996 | Casper | |
| 5,619,164 A | 4/1997 | Tomishima | |
| 5,821,769 A | 10/1998 | Douseki | |
| 5,956,278 A | 9/1999 | Itou | |
| 5,986,923 A * | 11/1999 | Zhang et al. ............ | 365/154 |
| 6,060,944 A | 5/2000 | Casper | |
| 6,087,893 A | 7/2000 | Oowaki et al. | |
| 6,111,394 A | 8/2000 | Casper | |
| 6,114,843 A | 9/2000 | Olah | |
| 6,177,826 B1 | 1/2001 | Mashiko et al. | |
| 6,236,666 B1 | 5/2001 | Mirov et al. | |
| 6,281,744 B1 | 8/2001 | Kang | |
| 6,380,799 B1 | 4/2002 | Chung et al. | |
| 6,414,883 B2 | 7/2002 | Hidaka et al. | |
| 6,441,663 B1 | 8/2002 | Chuang et al. | |
| 6,509,786 B2 | 1/2003 | Uekubo | |
| 6,560,139 B2 * | 5/2003 | Ma et al. ................ | 365/154 |
| 6,614,706 B2 | 9/2003 | Feurle | |
| 6,737,910 B2 | 5/2004 | Kitagawa et al. | |
| 6,775,112 B1 | 8/2004 | Smith et al. | |
| 6,836,179 B2 | 12/2004 | Mizuno | |
| 6,861,901 B2 | 3/2005 | Prexl et al. | |
| 6,906,582 B2 | 6/2005 | Kase et al. | |
| 6,909,320 B2 | 6/2005 | Chan et al. | |

(Continued)

OTHER PUBLICATIONS

Nii et la., "A 90 nm Low Power 32K-Byte Embedded SRAM with Gate Leakage Suppression Circuit for Mobile Applications", 2003 Symposium on VLSI Circuits Digest of Technical Papers, 2003, pp. 247-250, IEEE.

(Continued)

*Primary Examiner* — Alexander Sofocleous
(74) *Attorney, Agent, or Firm* — Daniel D. Hill

(57) ABSTRACT

An integrated circuit comprises a memory array and a bias circuit. The memory array comprises a plurality of memory cells arranged in a grid of rows and columns. A first conductor is coupled to a power supply voltage terminal of each of the plurality of memory cells. A second conductor is coupled to receive a power supply voltage. The memory array also includes a plurality of dummy cells. A transistor of one or more of the plurality of dummy cells has a first current electrode coupled to the first conductor, a second current electrode coupled to the second conductor, and a control electrode. The bias circuit is coupled to the control electrode of the transistor.

20 Claims, 6 Drawing Sheets

U.S. PATENT DOCUMENTS

| | | | |
|---|---|---|---|
| 6,933,772 | B1 | 8/2005 | Banerjee et al. |
| 7,026,802 | B2 | 4/2006 | Gradinariu |
| 7,064,601 | B2 | 6/2006 | Kwak et al. |
| 7,091,712 | B2 | 8/2006 | Miller et al. |
| 7,099,230 | B1 | 8/2006 | Tran |
| 7,110,317 | B2 * | 9/2006 | Song et al. ............ 365/226 |
| 7,126,370 | B2 | 10/2006 | Bhattacharya |
| 7,126,861 | B2 * | 10/2006 | Hose et al. ........ 365/189.09 |
| 7,135,842 | B2 | 11/2006 | Banerjee et al. |
| 7,164,291 | B2 | 1/2007 | Mair et al. |
| 7,208,974 | B1 | 4/2007 | Chui |
| 7,218,168 | B1 | 5/2007 | Rahman |
| 7,235,959 | B2 | 6/2007 | Sicard |
| 7,253,595 | B2 | 8/2007 | Oddoart et al. |
| 7,268,524 | B2 | 9/2007 | Kase et al. |
| 7,292,495 | B1 | 11/2007 | Kenkare et al. |
| 7,332,954 | B2 | 2/2008 | Ryu et al. |
| 7,339,416 | B2 | 3/2008 | Rincon-Mora et al. |
| 7,342,845 | B2 | 3/2008 | Somasekhar et al. |
| 7,372,764 | B2 | 5/2008 | Nautiyal et al. |
| 7,400,123 | B1 | 7/2008 | Voogel |
| 7,414,457 | B2 | 8/2008 | Ogawa et al. |
| 7,423,416 | B1 | 9/2008 | Quinones et al. |
| 7,432,693 | B2 | 10/2008 | Enjalbert |
| 7,439,718 | B2 | 10/2008 | Rozen et al. |
| 7,441,137 | B1 | 10/2008 | Mimberg |
| 7,463,013 | B2 | 12/2008 | Plojhar |
| 7,479,824 | B2 | 1/2009 | Bushman et al. |
| 7,554,312 | B2 | 6/2009 | Fulton et al. |
| 7,576,594 | B2 | 8/2009 | Shozo |
| 7,701,755 | B2 * | 4/2010 | Chen et al. ............ 365/154 |
| 7,737,720 | B2 | 6/2010 | Idgunji et al. |
| 7,750,610 | B2 | 7/2010 | Vorenkamp |
| 7,760,009 | B2 | 7/2010 | Yang et al. |
| 7,808,856 | B2 | 10/2010 | Ehrenreich et al. |
| 7,821,814 | B2 | 10/2010 | Yamoaka et al. |
| 7,863,971 | B1 | 1/2011 | Nayak et al. |
| 8,085,579 | B2 | 12/2011 | Inoue |
| 2007/0001223 | A1 | 1/2007 | Boyd et al. |
| 2007/0210855 | A1 | 9/2007 | Raimar |
| 2007/0229147 | A1 | 10/2007 | Doyle et al. |
| 2007/0252623 | A1 | 11/2007 | Zampaglione et al. |
| 2008/0001655 | A1 | 1/2008 | Pham et al. |
| 2008/0074176 | A1 | 3/2008 | Yamamoto |
| 2008/0170458 | A1 | 7/2008 | Haid et al. |
| 2008/0284504 | A1 | 11/2008 | Hirota et al. |
| 2009/0045677 | A1 | 2/2009 | Frey et al. |
| 2009/0066388 | A1 | 3/2009 | Park |
| 2009/0096433 | A1 | 4/2009 | Gerber et al. |
| 2009/0189636 | A1 | 7/2009 | Amedeo et al. |
| 2009/0237125 | A1 | 9/2009 | Zhao et al. |
| 2010/0123515 | A1 | 5/2010 | Sasaki et al. |
| 2010/0207687 | A1 | 8/2010 | Ramaraju et al. |
| 2010/0207688 | A1 | 8/2010 | Ramaraju et al. |
| 2011/0221516 | A1 | 9/2011 | Yamoaka et al. |

OTHER PUBLICATIONS

Tshanz et al., "Dynamic Sleep Transistor and Body Bias for Active Leakage Power Control Microprocessors", IEEE Journal of Solid State Circuits, Nov. 2003, pp. 1838-1845, vol. 38, No. 11, IEEE.

Bhavnagarwala et al., "A Pico-Joule Class, 1 GHz, 32 KByte X 64B DSP SRAM with Self Reverse Bias", 2003 Symposium of VLSI Circuits Digest of Technical Papers, 2003, pp. 251-252, IEEE.

Chang et al., "The 65 nm 16-MB Shared on-Die L3 CACHE for the Dual-Core Intel Xeon Processor 7100 Series", IEEE Journal of Solid-State Circuits, Apr. 2007, pp. 846-852, vol. 42, No. 4.

Vangal et al., "An 80-Tile Sub-100-W Teraflops Processor in 65-nm CMOS", IEEE Journal of Solid-State Circuits, Jan. 2008, pp. 29-41, vol. 43, No. 1.

Wang et al., "A 4.0 GHz 291 Mb Voltage-Scalable SRAM Design in a 32 nm High-k + Metal-Gate CMOS Technology with Integrated Power Management", IEEE Journal of Solid-State Circuits, vol. 45, No. 1, Jan. 2010, pp. 103-110.

Chen et al., "A 0.6 V Dual-Rail Compiler SRAM Design on 45 nm CMOS Technology With Adaptive SRAM Power for Lower VDD_min VLSIs", IEEE Journal of Solid-State Circuits, vol. 44, No. 4, Apr. 2009, pp. 1209-1215.

Khellah et al.; "A 256-Kb Dual-Vcc SRAM Building Block in 65-nm CMOS Process With Actibely Clamped Sleep Transistor"; IEEE Journal of Solid-State Circuits; Jan. 2007; pp. 233-242; vol. 42, No. 1; IEEE.

Sackinger et al.; "A High-Swing, High-Impedance MOS Cascode Circuit"; IEEE Journal of Solid-State Circuits; Feb. 1990; pp. 289-298; vol. 24, No. 1; IEEE.

* cited by examiner

INTEGRATED CIRCUIT HAVING VARIABLE MEMORY ARRAY POWER SUPPLY VOLTAGE

CROSS-REFERENCE TO RELATED APPLICATION

This application is related to a co-pending application having application Ser. No. 12/622,277, by Ravindraraj Ramaraju et al., entitled "Integrated Circuit Having Low Power Mode Voltage Regulator", and filed Nov. 19, 2009.

BACKGROUND

1. Field

This disclosure relates generally to integrated circuits, and more specifically, to an integrated circuit memory having a variable memory array power supply voltage.

2. Related Art

Lower power consumption has been gaining importance in integrated circuits due to, for example, wide spread use of portable and handheld applications. Most circuits in handheld devices are typically off or inactive, for example, in an idle or deep sleep mode, for a significant portion of time, consuming only leakage power. As transistor leakage currents increase with finer geometry manufacturing processes, it becomes more difficult to meet chip leakage targets using traditional power reduction techniques. Also, finer geometries make it possible for larger cache memories to be integrated on an integrated circuit. However, the increased size of cache memories results in an increased number of leakage paths. Because the cache memory is inactive most of the time, it is desirable to decrease the memory cell leakage.

There are several methods for reducing leakage currents of integrated circuits during a low power mode. One method involves providing a "virtual" ground terminal that can be at ground potential during a normal operating mode and then increased above ground during a low power operating mode to reduce the leakage current. However, as power supply voltages decrease, it becomes more important to maintain the increased voltage on the virtual ground terminal during the low power operating mode very accurately so that stored data is not inadvertently corrupted.

Therefore, what is needed is an integrated circuit that has less leakage current without affecting reliability.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
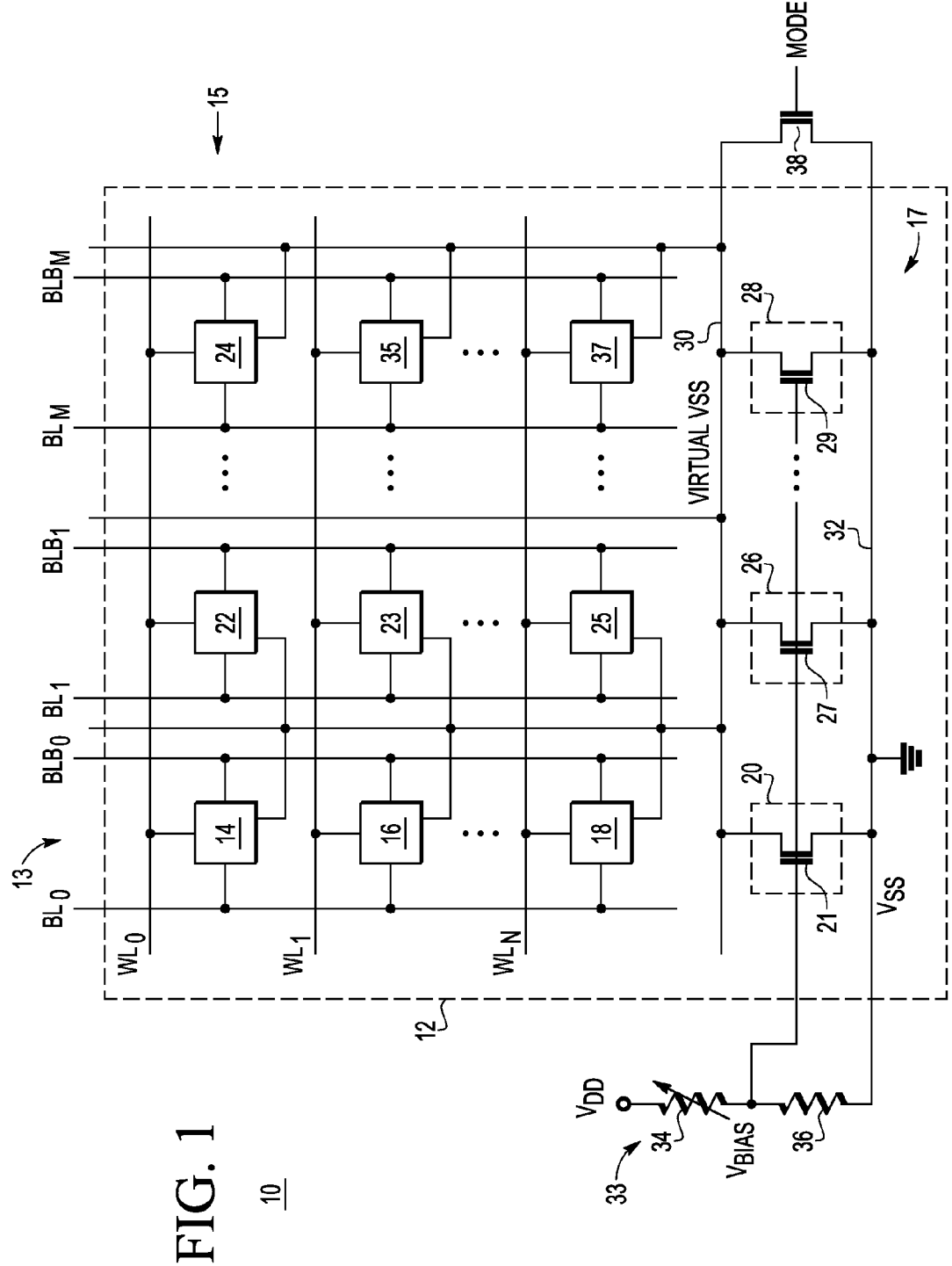
FIG. 1 illustrates, in partial block diagram form and partial schematic diagram form, an integrated circuit in accordance with an embodiment.

Generally, there is provided, an integrated circuit having a memory array. In one embodiment, the memory array comprises a plurality of static random access memory (SRAM) cells. The memory array has a normal operating mode and a standby mode. During the normal mode, the memory performs read and write operations with a full rail power supply voltage. The full rail power supply voltage is between a positive voltage and zero volts, or ground. In standby mode, the power supply voltage is lowered to reduce power consumption. In one embodiment, the power supply voltage to the memory array is lowered by increasing a voltage at the ground connection of the cells to a predetermined voltage above ground. The memory array includes a first conductor connected to ground and a second conductor that can be raised above ground by a predetermined voltage level. A voltage regulator is used to increase the voltage of the second conductor above ground during standby mode. The voltage regulator includes an N-channel transistor and a bias circuit. The N-channel transistor is within the array and is part of a memory cell. In one embodiment, the N-channel transistor is a pull-down transistor of an unused static random access memory (SRAM) cell on an edge of the array. The edge cell used in the voltage regulator can be a bit line end cell on one or both sides of the array. Also, the edge cell can be a word line end cell or corner cell. In one embodiment, the N-channel transistor is biased by a voltage divider formed using polysilicon resistors.

Using a memory cell transistor allows the voltage regulator to track changes in memory cell leakage due to process, voltage, and temperature variations. For example, if leakage current in the array increases with temperature, the current in the N-channel transistor will also increase. Also, because a memory array dummy edge cell is used, a number of edge cell transistors can be used in parallel to increase the amount of leakage current that can be sunk. Additionally, it is advantageous to distribute the total memory cell leakage current sunk across many edge cell transistors so that an electro-migration limit of the metal lines coupled to the source and drain of each of the transistors of the memory cell is not violated. Further, because unused dummy edge cells may already be in the array, very little circuitry, if any, needs to be added to the integrated circuit.

In one aspect, there is provided, an integrated circuit comprising: a memory array comprising: a plurality of memory cells arranged in a grid of rows and columns; a first conductor coupled to a power supply voltage terminal of each of the plurality of memory cells; a second conductor coupled to receive a power supply voltage; and a plurality of dummy cells, wherein a transistor of one or more of the plurality of dummy cells has a first current electrode coupled to the first conductor, a second current electrode coupled to the second conductor, and a control electrode; and a bias circuit coupled to the control electrode of the transistor. The plurality of dummy cells may comprise a row of dummy cells on an edge of the grid of rows and columns. The integrated circuit may further comprise a normal operating mode and a standby mode, wherein a first voltage on the first conductor is changed to a second voltage in response to entering the standby mode. The transistor may be characterized as being a memory cell pull-down transistor. The transistor may be characterized as being a memory cell pull-up transistor. The bias circuit may comprise a voltage divider. The voltage divider may comprise: a first resistive element having a first terminal coupled to a third conductor, and a second terminal coupled to the control electrode of the transistor; and a second resistive element having a first terminal coupled to the control electrode of the transistor, and a second terminal coupled to the second conductor. The voltage divider may comprise: a first resistive element having a first terminal coupled to a third conductor, and a second terminal coupled to the control electrode of the transistor; and a second resistive element having a first terminal coupled to the control electrode of the transistor, and a second terminal coupled to the first conductor. The integrated circuit may further comprise a mode select transistor having a first current electrode coupled to the first conductor, a second current electrode coupled to the second conductor, and a control electrode coupled to receive a mode signal, wherein the mode select transistor for coupling the first conductor to the second conductor in response to the mode signal being asserted.

In another aspect, there is provided, an integrated circuit comprising: a memory array comprising: a plurality of memory cells arranged in a grid of rows and columns; a first conductor coupled to a power supply voltage terminal of each of the plurality of memory cells; a second conductor coupled to receive a power supply voltage; and a plurality of dummy cells, wherein a transistor of one or more of the plurality of dummy cells has a first current electrode coupled to the first conductor, a second current electrode coupled to the second conductor, and a control electrode; a bias circuit coupled to the control electrode of the transistor; and a mode select transistor having a first current electrode coupled to the first conductor, a second current electrode coupled to the second conductor, and a control electrode coupled to receive a mode signal, wherein the mode select transistor couples the first conductor to the second conductor in response to the mode signal being asserted. The plurality of dummy cells may comprise a row of dummy cells located on an edge of the grid of rows and columns. The integrated circuit may further comprise a normal operating mode and a standby mode, wherein a first voltage on the first conductor is changed to a second voltage in response to entering the standby mode. The transistor may be characterized as being a memory cell pull-down transistor. The transistor may be characterized as being a memory cell pull-up transistor. The bias circuit may comprise a voltage divider, the voltage divider may comprise: a first resistive element having a first terminal coupled to a third conductor, and a second terminal coupled to the control electrode of the transistor; and a second resistive element having a first terminal coupled to the control electrode of the transistor, and a second terminal coupled to the second conductor. The voltage divider may comprise: a first resistive element having a first terminal coupled to a third conductor, and a second terminal coupled to the control electrode of the transistor; and a second resistive element having a first terminal coupled to the control electrode of the transistor, and a second terminal coupled to the first conductor.

In yet another aspect, there is provided, an integrated circuit comprising: a memory array comprising: a plurality of memory cells arranged in a grid of rows and columns; a first conductor coupled to a power supply voltage terminal of each of the plurality of memory cells; a second conductor coupled to ground; and a plurality of dummy cells on an edge of the grid of rows and columns, wherein a transistor of one or more of the plurality of dummy cells has a first current electrode coupled to the first conductor, a second current electrode coupled to the second conductor, and a control electrode; and a bias circuit coupled to the control electrode of the transistor. The bias circuit may comprise a voltage divider comprising: a first resistive element having a first terminal coupled to a third conductor, and a second terminal coupled to the control electrode of the transistor; and a second resistive element having a first terminal coupled to the control electrode of the transistor, and a second terminal coupled to the second conductor. The voltage divider may comprise: a first resistive element having a first terminal coupled to a third conductor, and a second terminal coupled to the control electrode of the transistor; and a second resistive element having a first terminal coupled to the control electrode of the transistor, and a second terminal coupled to the first conductor. The integrated circuit may further comprise a mode select transistor having a first current electrode coupled to the first conductor, a second current electrode coupled to the second conductor, and a control electrode coupled to receive a mode signal, wherein the mode select transistor for coupling the first conductor to the second conductor in response to the mode signal being asserted. The transistor may be characterized as being a memory cell pull-down transistor.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or a letter "B" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 illustrates, in partial block diagram form and partial schematic diagram form, an integrated circuit 10 in accordance with an embodiment. Integrated circuit 10 includes a memory array 12, a voltage divider 33, and an enable transistor 38. Memory array 12 is a conventional SRAM array and includes a plurality of memory cells organized in rows and columns. Memory array 12 includes word lines WL0, WL1, and WLN, and bit line pairs BL0/BLB0, BL1/BLB1, and BLM/BLBM, where N and M are integers. A row of memory cells includes a word line and all of the memory cells connected to the word line. Memory cells 14, 22, and 24 and word line WL0 form a row 15 of memory array 12. Also, a row is formed by memory cells 16, 23, and 35 and word line WL1. Another row is formed by memory cells 18, 25, and 37 and word line WLN. A column of memory cells includes a bit line or bit line pair and all of the memory cells connected to the bit line pair. Memory cells 14, 16, and 18 and bit line pair BL0/BLB0 form a column 13 of memory cells. Likewise, memory cells 22, 23, and 25 are coupled to bit line pair BL1/BLB1, and memory cells 24, 35, and 37 are coupled to bit line pair BLM/BLBM. A power supply conductor 30 labeled "VIRTUAL VSS" is coupled to each of the memory cells in the array. During a normal operating mode, conductor 30 is coupled to ground through conductor 32, labeled "VSS". During a standby operating mode, conductor 30 is raised above ground by a predetermined voltage level. For the purposes of simplicity and clarity, another power supply conductor for supplying a positive power supply is not illustrated in FIG. 1.

A memory array may comprise pluralities of rows and columns that are generally arranged to form a grid. Memory cells in the interior portion of the grid each are adjacent to four other cells. Memory cells on an outside edge of the array may be adjacent to three other cells unless the cell is on a corner, then it is adjacent to two other cells. For example, memory cell 14 is a corner cell adjacent to cells 16 and 22. Memory cell 16 is on a side, or edge, and is adjacent to cells 14, 23, and 18. The edge cells can be functional cells or dummy cells. Column 13 and row 15 are illustrated as functional cells on an edge of memory array 12. Row 17 is a row of dummy edge cells including cells 20, 26, and 28. Frequently, edge cells of an array are not used as memory cells because the edge of the array may be more likely to have defective cells. The edge cells that are not used to store information may be referred to as "dummy cells" and may not be coupled to the bit lines, word lines, or power supply voltage terminals. However, even if the edge cells are not functional memory cells, they may provide lithographic and/or manufacturing process aids to ensure the uniformity of interior memory cells.

In accordance with the illustrated embodiment of FIG. 1, one or more dummy cells on an edge of the memory array are configured to provide a voltage regulation circuit that is used to elevate a memory cell power supply terminal above ground potential. Dummy cells 20, 26 and 28 are representative memory cells on an edge of memory array 12, and are configured to regulate the power supply voltage provided to memory array 12 during a standby operating mode. As illustrated, pull-down N-channel transistors 21, 27, and 29 of dummy memory cells 20, 26, and 28, respectively, are used to regulate the VIRTUAL VSS voltage at a predetermined voltage level above ground in response to a bias voltage labeled "VBIAS". Using the dummy cell N-channel pull-down transistors avoids a methodology or process prohibition regarding using a memory cell transistor outside of a memory cell instance. Furthermore, using the dummy cells as part of a voltage regulator saves area because, due to process rules, the dummy cells are already available.

In the illustrated embodiment, VBIAS is provided by a voltage divider 33. In other embodiments, a different type of circuit may be used to provide VBIAS, such as for example, a circuit having transistors or diodes. Also, in other embodiments, any number of dummy cells, or all of the dummy cells, can be used to provide a pull-down transistor between VIRTUAL VSS and VSS. Additionally, the voltage level of VIRTUAL VSS can be adjusted by increasing or decreasing the number of active pull-down transistors. The control electrode of an active pull-down transistor would receive bias voltage VBIAS and the control electrode of inactive pull-down transistors would receive power supply voltage VSS. As illustrated, the dummy edge cells 20, 26, and 28 form a row, however, the edge cells can be any portion of a row, a column, or a combination of dummy cell rows and dummy cell columns. Further, VSS may be coupled to a different potential than ground.

Transistors 21, 27, and 29 each have a first current electrode (drain) connected to conductor 30, a control electrode (gate) for receiving a bias voltage labeled VBIAS, and a second current electrode (source) connected to a conductor 32 labeled "VSS". Bias voltage VBIAS is provided by voltage divider 33. Voltage divider 33 includes variable resistor 34 and resistor 36. Voltage divider 33 is formed outside of memory array 12. Variable resistor 34 has a first terminal connected to VDD, and a second terminal connected to the control electrodes (gates) of transistors 21, 27, and 29. Resistor 36 has a first terminal connected to the second terminal of resistor 34, and a second terminal connected to VSS. In one embodiment, resistors 34 and 36 are polysilicon resistors. Variable resistor 34 may be formed by providing a plurality of series-connected resistors with selectable taps. Also, in one embodiment, power supply voltage VDD is equal to about 1.0 volts and VIRTUAL VSS is elevated about 0.2 volts above ground during standby mode. In other embodiments, voltage VIRTUAL VSS may be elevated above ground by a different voltage.

N-channel transistor 38 has a first current electrode coupled to conductor 30, a control electrode for receiving a mode signal labeled "MODE", and a second current electrode coupled to conductor 32. Transistor 38 is formed outside of memory array 12 using a conventional logic transistor manufacturing process. During a normal operating mode, mode signal MODE is asserted as a logic high. Transistor 38 is conductive, causing conductor 30 to be reduced to ground. During a standby operating mode, mode signal MODE is negated as a logic low, transistor 38 is substantially non-conductive, and N-channel transistors 21, 27, and 29 are biased by voltage divider 33 to allow the voltage of conductor 30 to increase above ground by a predetermined voltage level. Variable resistor 34 is provided to allow voltage VIRTUAL VSS to be adjusted.

Figure 2:
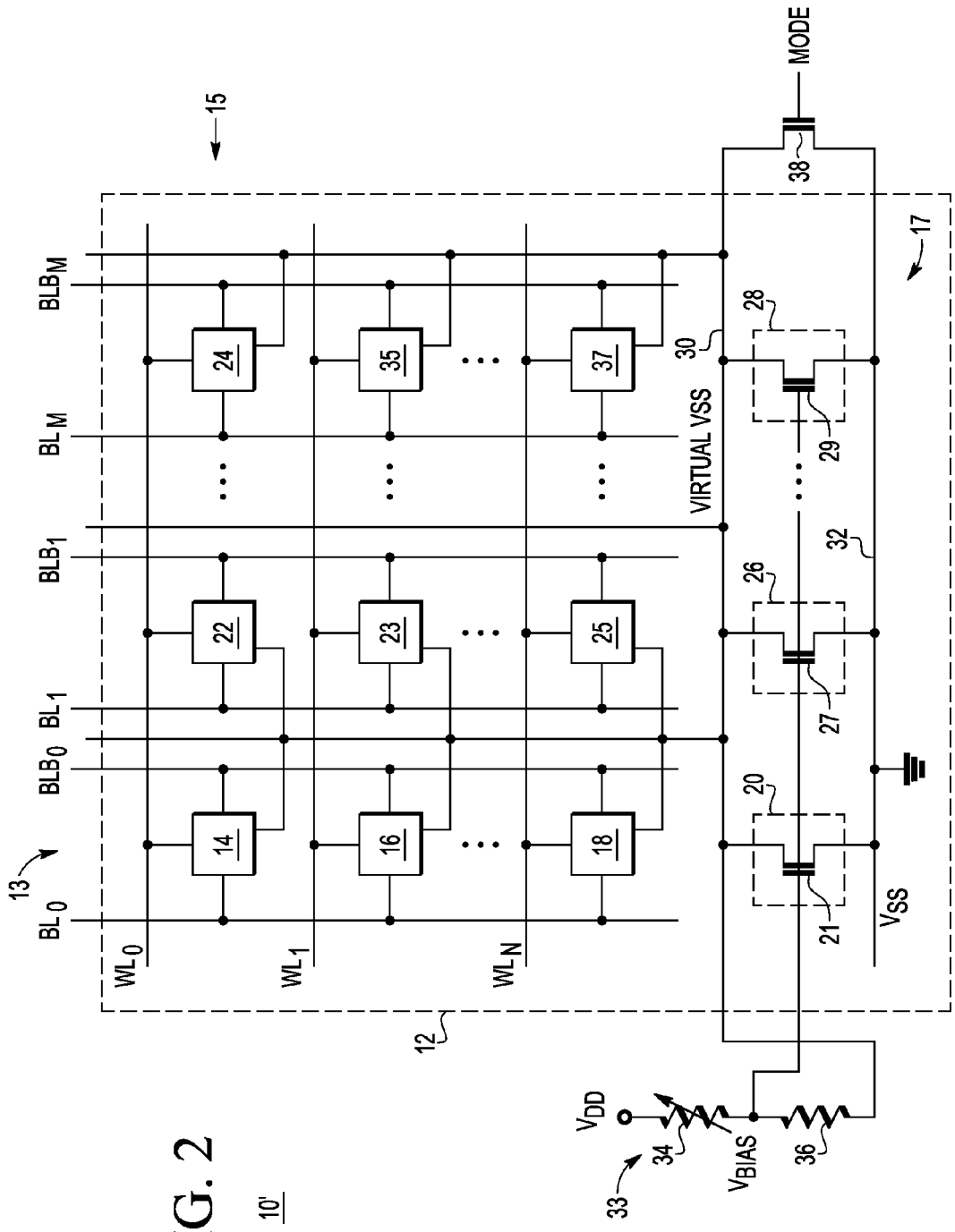
FIG. 2 illustrates, in partial block diagram form and partial schematic diagram form, an integrated circuit in accordance with another embodiment.

FIG. 2 illustrates, in partial block diagram form and partial schematic diagram form, an integrated circuit 10' in accordance with another embodiment. Integrated circuit 10' is the same as integrated circuit 10 except that in integrated circuit 10' the second terminal of resistor 36 is coupled to conductor 30 instead of to conductor 32 to receive voltage VIRTUAL VSS in a feedback configuration. Coupling voltage divider 33 to voltage VIRTUAL VSS allows the voltage of VIRTUAL VSS to better track process and temperature differences of memory array 12. For example, if the leakage current of memory array 12 increases with increasing temperature, the VIRTUAL VSS will increase as well. Voltage VBIAS will increase with voltage VIRTUAL VSS, causing transistors 21, 27, and 29 to become more conductive pulling the voltage level of VIRTUAL VSS back towards the desired voltage level.

Figure 3:
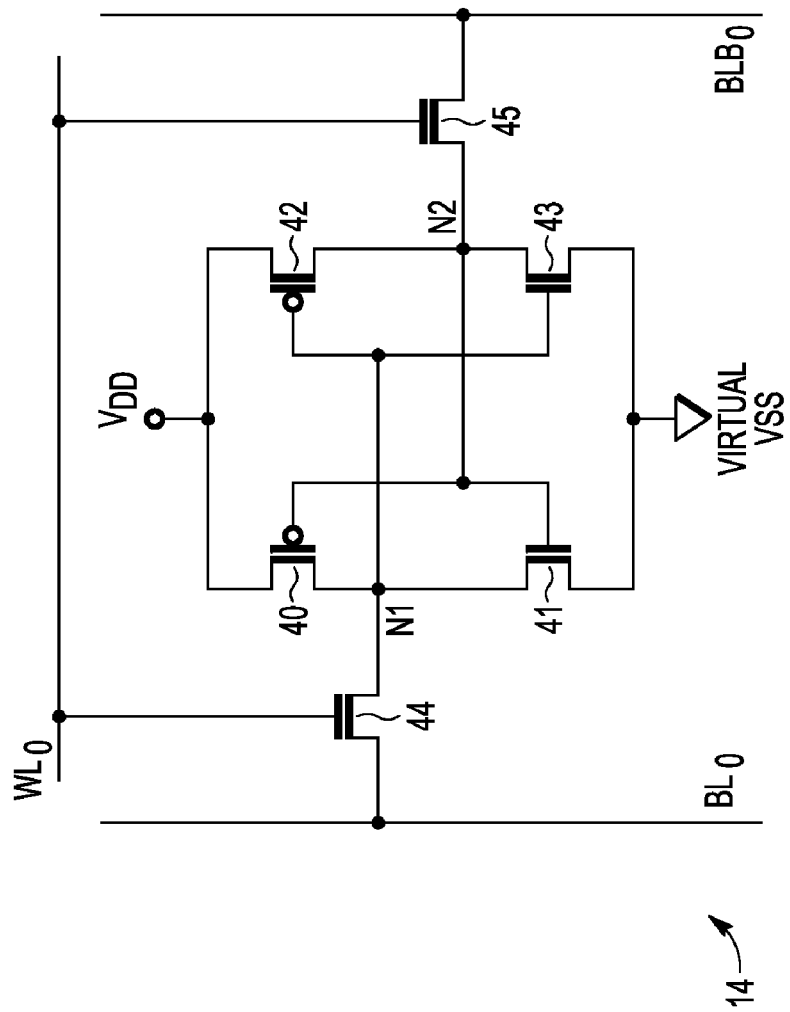
FIG. 3 illustrates, in schematic diagram form, a memory cell of the integrated circuit of FIG. 1 or FIG. 2.

FIG. 3 illustrates, in schematic diagram form, memory cell 14 of integrated circuits 10 or 10'. Memory cell 14 is a conventional SRAM six-transistor memory cell, except that memory cell 14, and the other functional cells of memory array 12 are coupled to power supply voltage terminal VIRTUAL VSS instead of to VSS. Memory cell 14 includes P-channel pull-up transistors 40 and 42, N-channel pull-down transistors 41 and 43, and N-channel access transistors 44 and 45. As can be seen, memory cell 14 is connected to bit line pair BL0/BLB0 and to word line WL0 to be a functional SRAM cell for storing a data bit. P-channel transistor 40 and N-channel transistor 41 form an inverter. P-channel transistor 42 and N-channel transistor 43 also form an inverter. The inverters are cross-coupled to form a latch with storage nodes N1 and N2. The storage nodes are coupled to bit line pair BL0/BLB0 by access transistors 44 and 45. The gates of access transistors 44 and 45 are coupled to word line WL0.

Figure 4:
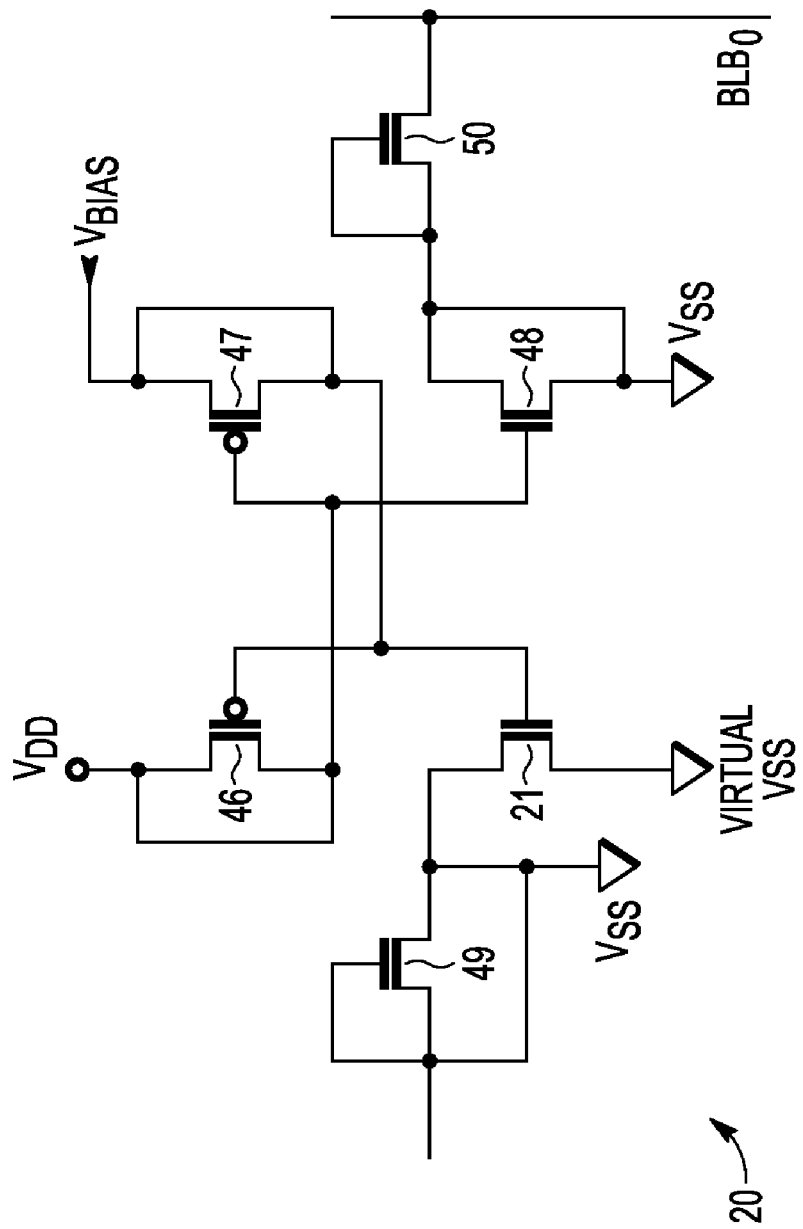
FIG. 4 illustrates, in schematic diagram form, a dummy cell in accordance with the embodiment of FIG. 1 or FIG. 2.

FIG. 4 illustrates, in schematic diagram form, dummy cell 20 in accordance with the embodiment of FIG. 1 or FIG. 2. Dummy cell 20 includes P-channel transistors 46 and 47, N-channel transistors 21 and 48, and N-channel transistors 49 and 50. The transistors of dummy cell 20 have the same general layout as those of functional memory cell 14, except that the transistors of memory cell 20 are connected together differently. As can be seen in the layout of dummy cell 20 the gate of N-channel transistor 21 is coupled to receive bias voltage VBIAS, the drain is coupled to VSS, and the source is coupled to VIRTUAL VSS. Transistors 46, 47, 48, 49, and 50 either have their terminals shorted together or coupled together in such a way as to inhibit their operation. In another embodiment, N-channel transistor 48 may be used to couple VIRTUAL VSS to VSS instead of transistor 21. For example, N-channel pull-down transistor 48 can be coupled like transistor 21, that is, the gate of transistor 48 may be coupled to receive VBIAS, the drain may be coupled to VSS, and the source may be coupled to VIRTUAL VSS. In another embodiment, both of pull-down transistors 21 and 48 can be coupled together in parallel. Also, even though dummy cell 20 includes all six transistors of the conventional six transistor SRAM cell of the array, in other embodiments, the dummy cell may be a partial memory cell having fewer transistors than the conventional memory cell that it is a dummy of. One or more transistors of a partial dummy cell can still be used for biasing VIRTUAL VSS in accordance with the illustrated embodiment. In addition, in other embodiments, the memory cells of the array and the dummy cells may have more than six transistors, for example, the memory array may have eight transistor SRAM cells.

Figure 5:
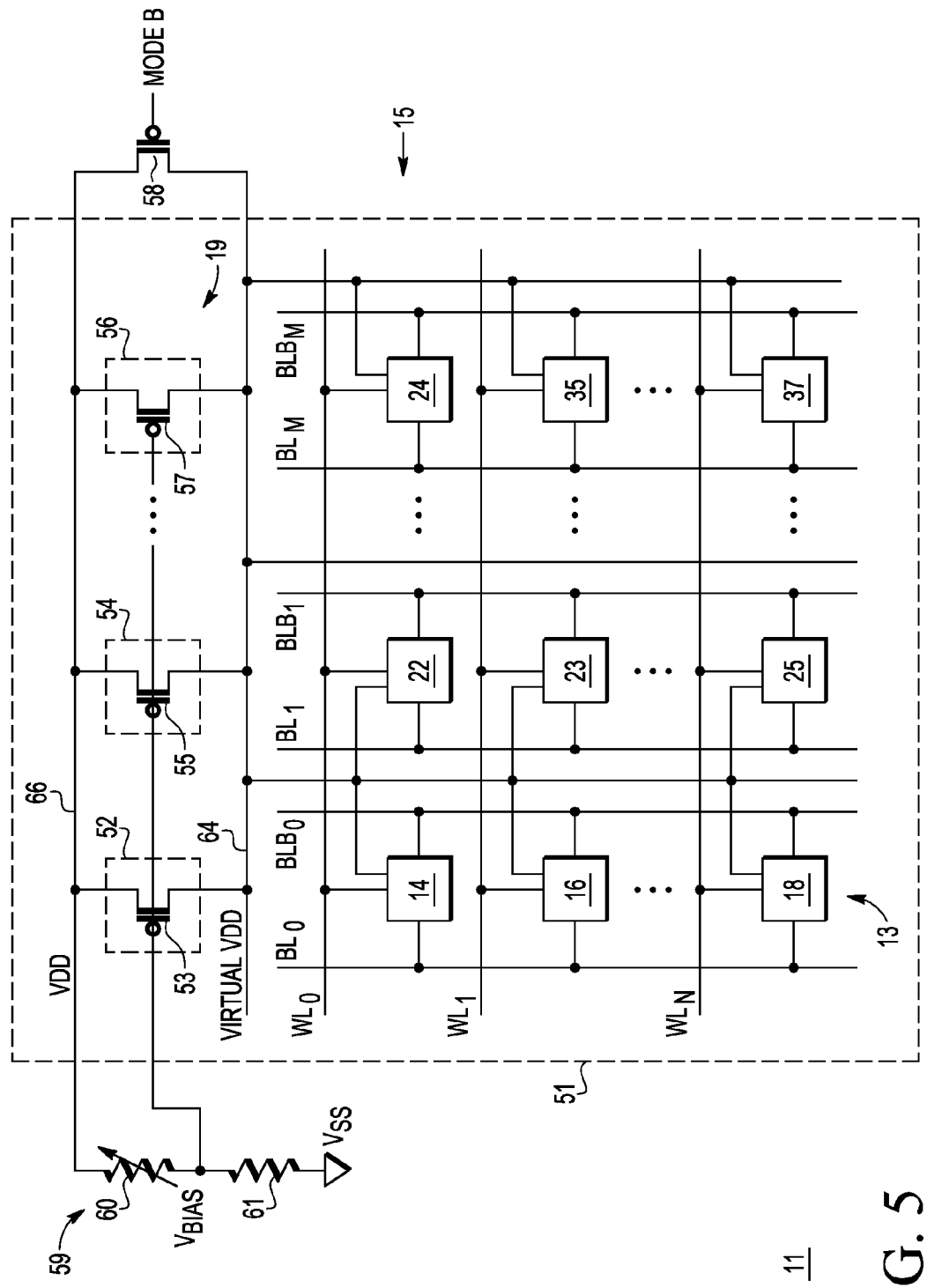
FIG. 5 illustrates, in partial block diagram form and partial schematic diagram form, an integrated circuit in accordance with another embodiment.

FIG. 5 illustrates, in partial block diagram form and partial schematic diagram form, integrated circuit 11 in accordance with another embodiment. Integrated circuit 11 is similar to integrated circuit 10, except that instead of increasing VIRTUAL VSS to a predetermined voltage level above ground, a voltage level of VIRTUAL VDD is reduced below power supply voltage VDD by a predetermined voltage. In FIG. 5, a dummy row of memory cells 19 includes dummy cells 52, 54, and 56. A P-channel transistor in each dummy cell is used to provide a pull-up for VIRTUAL VDD. For example, referring back to FIG. 4, one or both of P-channel transistors 46 and 47 can be connected between VDD and VIRTUAL VDD and used as a pull-up device. Voltage divider 59 includes variable resistor 60 and resistor 61 to provide bias voltage VBIAS to the gates of dummy cell transistors 53, 55, and 57. In the illustrated embodiment, voltage divider 59 is formed outside of array 52. Variable resistor 60 allows the voltage level of VBIAS to be adjusted so that the predetermined voltage level of VIRTUAL VDD can be adjusted. In voltage divider 59, a first terminal of resistor 60 is connected to conductor 66, and a second terminal is connected to the gates of dummy cell transistors 53, 55, and 57. A first terminal of resistor 61 is coupled to the second terminal of resistor 60, and a second terminal is connected to VSS. Transistor 58 is formed outside of the array and is formed using a conventional logic transistor manufacturing process.

During a normal operating mode, mode signal MODE B is asserted as a logic low voltage. Transistor 58 is conductive, causing VIRTUAL VDD on conductor 64 to be pulled up to power supply voltage VDD. During a standby operating mode, mode signal MODE B is negated as a logic high, transistor 58 is substantially non-conductive, and P-channel transistors 53, 55, and 57 are biased by voltage divider 59 to allow the voltage of conductor 64 to decrease below VDD by a predetermined voltage level.

Figure 6:
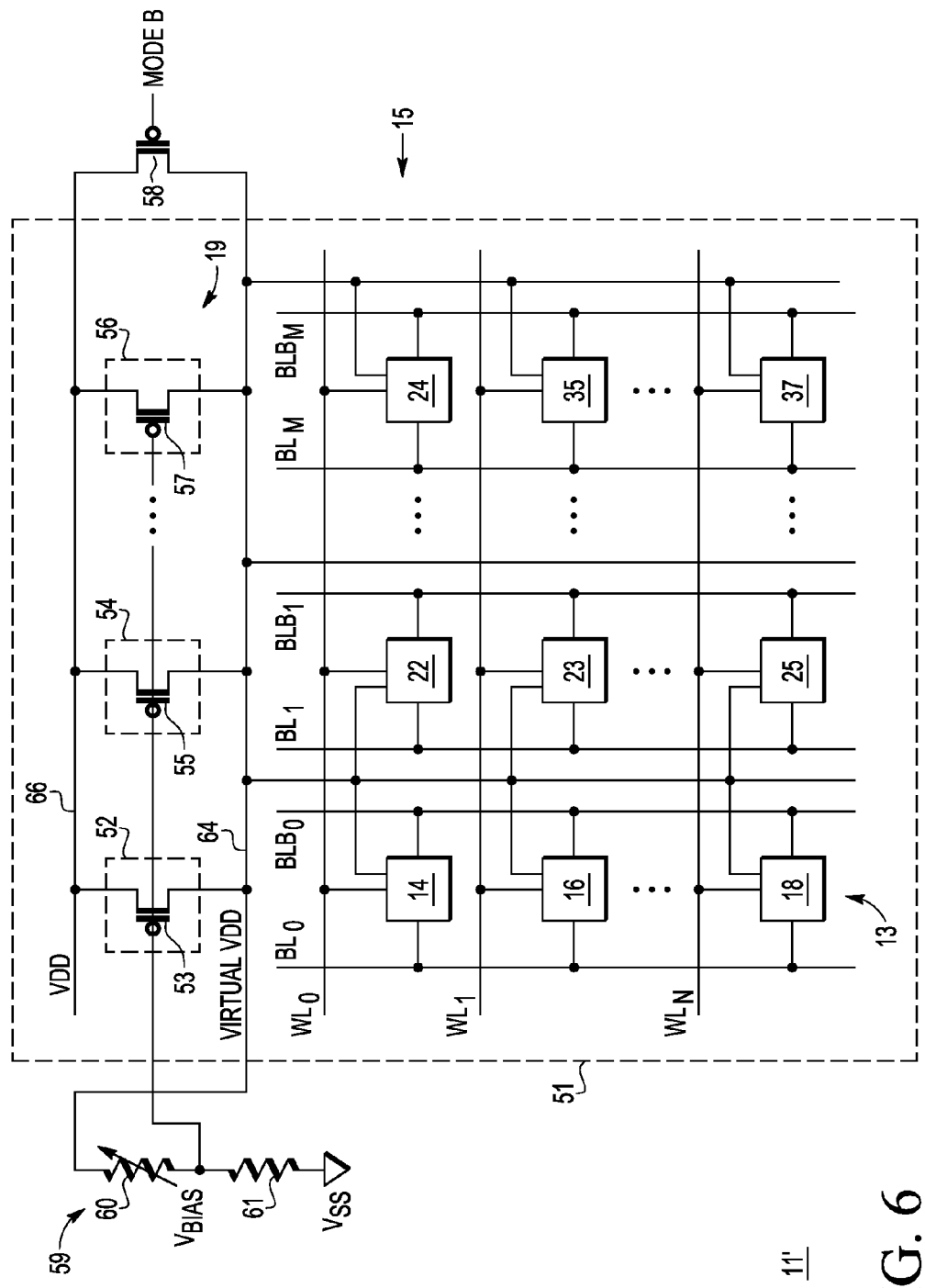
FIG. 6 illustrates, in partial block diagram form and partial schematic diagram form, an integrated circuit in accordance with another embodiment.

FIG. 6 illustrates, in partial block diagram form and partial schematic diagram form, integrated circuit 11' in accordance with another embodiment. Integrated circuit 11' is the same as integrated circuit 11 except that voltage divider 59 is coupled between VIRTUAL VDD and VSS in a feedback arrangement instead of between VDD and VSS as illustrated in FIG. 5. Coupling voltage divider 59 to voltage VIRTUAL VDD allows the voltage of VIRTUAL VDD to better track changes in memory cell leakage due to process, voltage, and temperature variations. For example, if the leakage current of memory array 12 increases with increasing temperature, the VIRTUAL VDD will decrease as well. Voltage VBIAS will decrease with voltage VIRTUAL VDD, causing transistors 53, 55, and 57 to become more conductive pulling the voltage level of VIRTUAL VDD back up towards the desired voltage level.

The illustrated embodiments describe either pulling-down VDD or pulling-up VSS to reduce the power supply voltage. In another embodiment, the power supply voltage to the memory array may be reduced by reducing VDD and increasing VSS at the same time.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
   a memory array comprising:
      a plurality of memory cells arranged in a grid of rows and columns;
      a first conductor coupled to a power supply voltage terminal of each of the plurality of memory cells;
      a second conductor coupled to receive a power supply voltage; and
      a plurality of dummy cells, wherein a transistor of one or more of the plurality of dummy cells has a first current electrode coupled to the first conductor, a second current electrode coupled to the second conductor, and a control electrode; and
   a bias circuit coupled to the control electrode of the transistor.

2. The integrated circuit of claim 1, wherein the plurality of dummy cells comprises a row of dummy cells on an edge of the grid of rows and columns.

3. The integrated circuit of claim 1, wherein the integrated circuit further comprises a normal operating mode and a standby mode, wherein a first voltage on the first conductor is changed to a second voltage in response to entering the standby mode.

4. The integrated circuit of claim 1, wherein the transistor is characterized as being a memory cell pull-down transistor.

5. The integrated circuit of claim 1, wherein the transistor is characterized as being a memory cell pull-up transistor.

6. The integrated circuit of claim 1, wherein the bias circuit comprises a voltage divider, the voltage divider comprising:
   a first resistive element having a first terminal coupled to a third conductor, and a second terminal coupled to the control electrode of the transistor; and
   a second resistive element having a first terminal coupled to the control electrode of the transistor, and a second terminal coupled to the second conductor.

7. The integrated circuit of claim 1, wherein the bias circuit comprises a voltage divider, the voltage divider comprising:
   a first resistive element having a first terminal coupled to a third conductor, and a second terminal coupled to the control electrode of the transistor; and
   a second resistive element having a first terminal coupled to the control electrode of the transistor, and a second terminal coupled to the first conductor.

8. The integrated circuit of claim 1, further comprising a mode select transistor having a first current electrode coupled to the first conductor, a second current electrode coupled to the second conductor, and a control electrode coupled to receive a mode signal, wherein the mode select transistor couples the first conductor to the second conductor in response to the mode signal being asserted.

9. An integrated circuit comprising:
   a memory array comprising:
      a plurality of memory cells arranged in a grid of rows and columns;
      a first conductor coupled to a power supply voltage terminal of each of the plurality of memory cells;
      a second conductor coupled to receive a power supply voltage; and
      a plurality of dummy cells, wherein a transistor of one or more of the plurality of dummy cells has a first current electrode coupled to the first conductor, a second current electrode coupled to the second conductor, and a control electrode;
   a bias circuit coupled to the control electrode of the transistor; and
   a mode select transistor having a first current electrode coupled to the first conductor, a second current electrode coupled to the second conductor, and a control electrode coupled to receive a mode signal, wherein the mode select transistor couples the first conductor to the second conductor in response to the mode signal being asserted.

10. The integrated circuit of claim 9, wherein the plurality of dummy cells comprises a row of dummy cells located on an edge of the grid of rows and columns.

11. The integrated circuit of claim 9, wherein the integrated circuit further comprises a normal operating mode and a standby mode, wherein a first voltage on the first conductor is changed to a second voltage in response to entering the standby mode.

12. The integrated circuit of claim 9, wherein the transistor is characterized as being a memory cell pull-down transistor.

13. The integrated circuit of claim 9, wherein the transistor is characterized as being a memory cell pull-up transistor.

14. The integrated circuit of claim 9, wherein the bias circuit comprises a voltage divider, the voltage divider comprising:
   a first resistive element having a first terminal coupled to a third conductor, and a second terminal coupled to the control electrode of the transistor; and
   a second resistive element having a first terminal coupled to the control electrode of the transistor, and a second terminal coupled to the second conductor.

15. The integrated circuit of claim 9, wherein the bias circuit comprises a voltage divider, the voltage divider comprising:
   a first resistive element having a first terminal coupled to a third conductor, and a second terminal coupled to the control electrode of the transistor; and
   a second resistive element having a first terminal coupled to the control electrode of the transistor, and a second terminal coupled to the first conductor.

16. An integrated circuit comprising:
   a memory array comprising:
      a plurality of memory cells arranged in a grid of rows and columns;
      a first conductor coupled to a power supply voltage terminal of each of the plurality of memory cells;
      a second conductor coupled to ground; and
      a plurality of dummy cells on an edge of the grid of rows and columns, wherein a transistor of one or more of the plurality of dummy cells has a first current electrode coupled to the first conductor, a second current electrode coupled to the second conductor, and a control electrode;
   a bias circuit coupled to the control electrode of the transistor.

17. The integrated circuit of claim 16, wherein the bias circuit comprises a voltage divider, the voltage divider comprising:
   a first resistive element having a first terminal coupled to a third conductor, and a second terminal coupled to the control electrode of the transistor; and
   a second resistive element having a first terminal coupled to the control electrode of the transistor, and a second terminal coupled to the second conductor.

18. The integrated circuit of claim 16, wherein the bias circuit comprises a voltage divider, the voltage divider comprising:

a first resistive element having a first terminal coupled to a third conductor, and a second terminal coupled to the control electrode of the transistor; and a second resistive element having a first terminal coupled to the control electrode of the transistor, and a second terminal coupled to the first conductor.

19. The integrated circuit of claim 16, further comprising a mode select transistor having a first current electrode coupled to the first conductor, a second current electrode coupled to the second conductor, and a control electrode coupled to receive a mode signal, wherein the mode select transistor couples the first conductor to the second conductor in response to the mode signal being asserted.

20. The integrated circuit of claim 16, wherein the transistor is characterized as being a memory cell pull-down transistor.

* * * * *